(12) United States Patent
Edmonson (10) Patent No.: US 6,255,915 B1
(45) Date of Patent: Jul. 3, 2001

(54) DIFFERENTIAL SURFACE ACOUSTIC WAVE FILTER HAVING BALANCED OUTPUTS

(75) Inventor: Peter J. Edmonson, Hamilton (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 09/309,163

(22) Filed: May 10, 1999

(51) Int. Cl.[7] ........................................... H03H 9/64

(52) U.S. Cl. ..................... 333/193; 333/195; 310/313 B; 310/313 D (58) Field of Search ..................... 333/193–196; 310/313 R, 313 B, 313 C, 313 D (56) References Cited

U.S. PATENT DOCUMENTS

| | | | |
|---|---|---|---|
| 5,568,002 | * 10/1996 | Kawakatsu et al. | 333/193 X |
| 5,790,000 | * 8/1998 | Dai et al. | 333/193 |
| 5,835,990 | * 11/1998 | Saw et al. | 310/313 D |

FOREIGN PATENT DOCUMENTS

| | | |
|---|---|---|
| 19638370 | 4/1998 | (DE) . |
| 19724258 | 12/1998 | (DE) . |
| 0 800 270 A2 | * 10/1997 | (EP) . |
| 0872954 | 10/1998 | (EP) . |

OTHER PUBLICATIONS

"High Performance Balanced Type SAW Filters in the Range of 900 MHZ and 1.9GHz", Endoh, G et al., IEEE Ultrasonics Symposium, New York, NY, Oct. 5, 1997, pp. 41–44.

Radiation Conductance and Grating Reflectivity Weighting Parameters for Dual Mode Leaky–SAW Resonator Filter Design, Edmonson, P.J. and Campbell, C.K., Department of Electrical and Computer Engineering, McMaster University, Hamilton, Canada, IEEE 1994 Ultrasonics Symposium, pp. 75–79.

"Coupling–Of–Modes Studies Of Surface Acoustic Wave Oscillators And Devices", Edmonson, P.J., A Thesis Submitte to the School of Graduate Studies in Partial Fulfillment of Requirements for Degree of Doctor of Philosophy, McMaster University, Feb. 1995, pp. 19, 83.

* cited by examiner

Primary Examiner—Benny Lee
Assistant Examiner—Barbara Summons
(74) Attorney, Agent, or Firm—Jones, Day, Reavis & Pogue; Charles B. Meyer, Esq.; Krishna K. Pathiyal, Esq.

(57) ABSTRACT

A differential SAW filter having a cascaded structure includes including an input SAW stage and an output SAW stage. The two SAW stages are configured so that the distance of travel of the surface acoustic waves from a single unbalanced input of the input stage to the dual balanced outputs of the output stage is electrically equidistant, thus resulting in a balanced differential output. The input stage includes a single unbalanced input coupled to a pair of outer IDTs, which both launch a surface acoustic wave to a single input stage inner IDT. The input stage inner IDT connects to the input IDT of the output SAW stage, which launches a surface acoustic wave to a pair of identical, but inverted output IDTs that form the differential, balanced output signals.

27 Claims, 9 Drawing Sheets

DIFFERENTIAL SURFACE ACOUSTIC WAVE FILTER HAVING BALANCED OUTPUTS

BACKGROUND OF THE INVENTION

1. Technical Field

This invention is related to the field of surface acoustic wave ("SAW") filters. In particular, the invention is related to SAW filters that are useful in UHF radio transceivers, either fixed or mobile, that require frequency selectivity and image rejection in the transceiver front-end prior to a differential mixer. However, the teachings of this invention are applicable to any type of electronic circuit that employs a SAW filter having balanced outputs or inputs as the case may be.

2. Description of the Related Art

Dual-mode leaky SAW structures were reported in the literature by Morita in 1992 (T. Morita, Y. Watanabe, M. Tanaka and Y. Nakazawa, "Wideband Low Loss Double Mode SAW filters," Proc. 1992 IEEE Ultrasonics Symp., October 20–23) The layout of this type of SAW consists of a central inter-digital transducer ("IDT") surrounded by two other IDTs connected in parallel with a external connection. On either end of the IDTs are reflectors. This resonator structure is usually then cascaded with another identical device to produce a filter with reasonably good attributes. Usual operation of this filter is to have a single input and a single output. In other words, these SAW devices do not provide a differential output signal.

Figure 1:
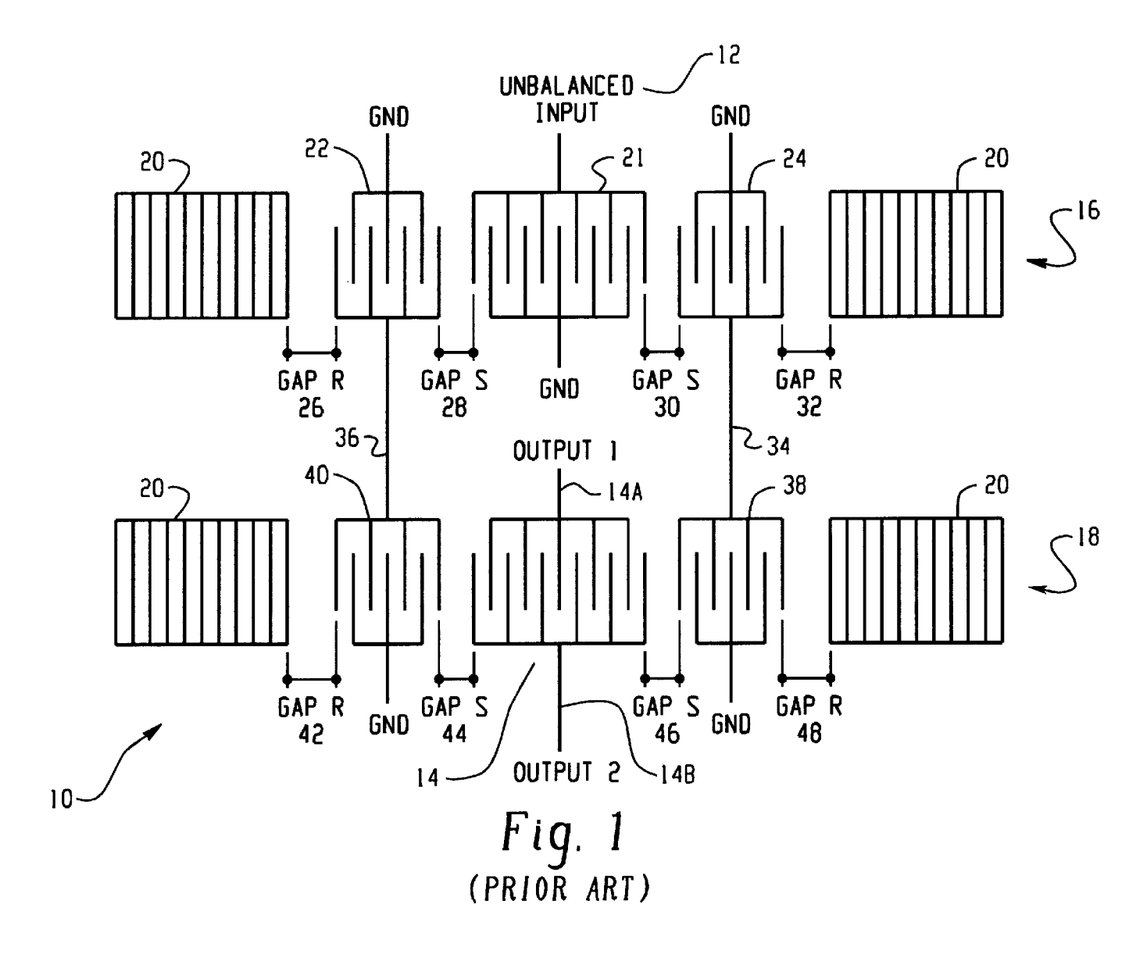
FIG. 1 is a layout diagram of a prior art cascaded SAW filter having a pair of differential outputs that are not balanced.
Figure 2:
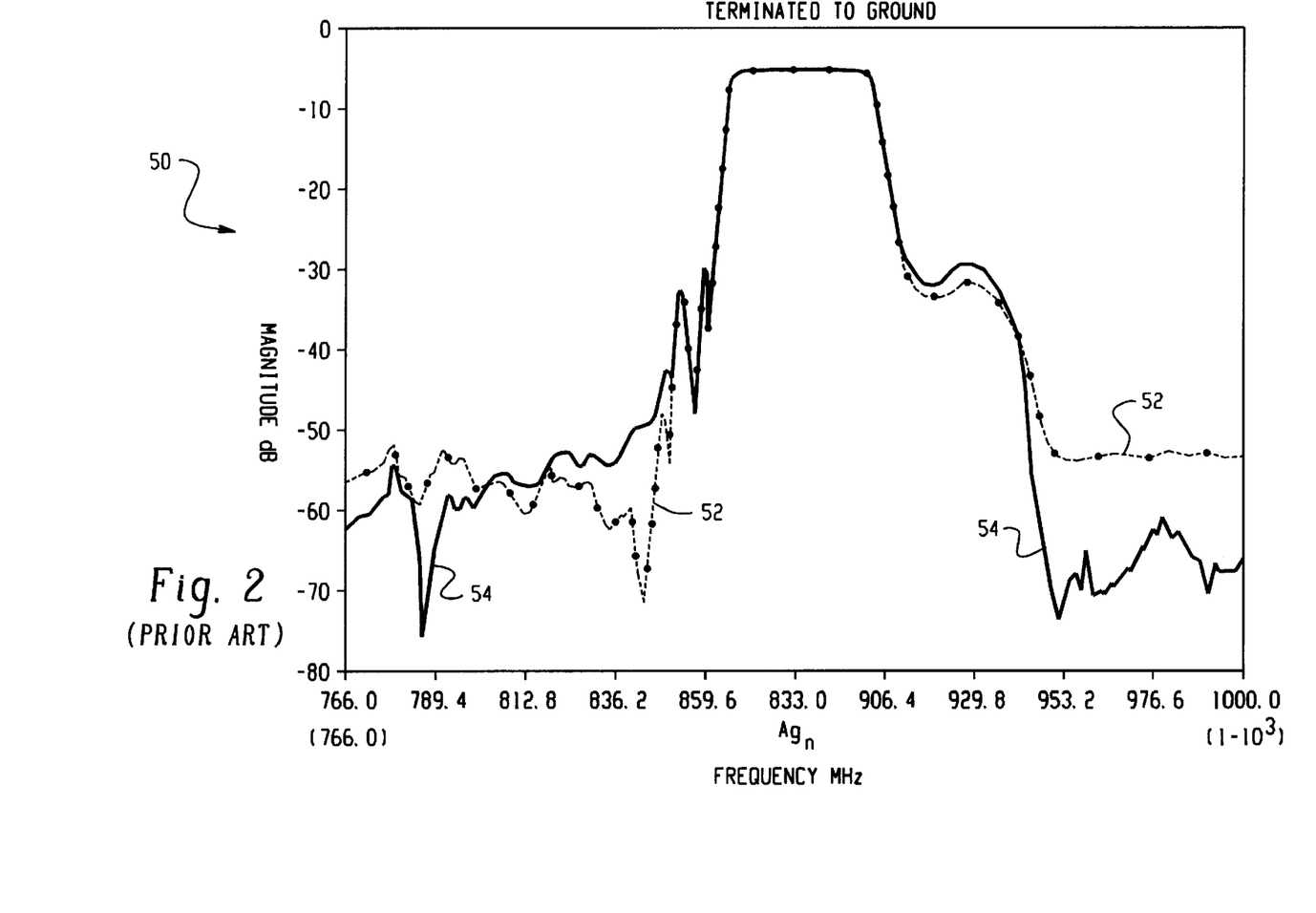
FIG. 2 is a plot showing the measured wideband response of the prior art SAW filter of FIG. 1.
Figure 3:
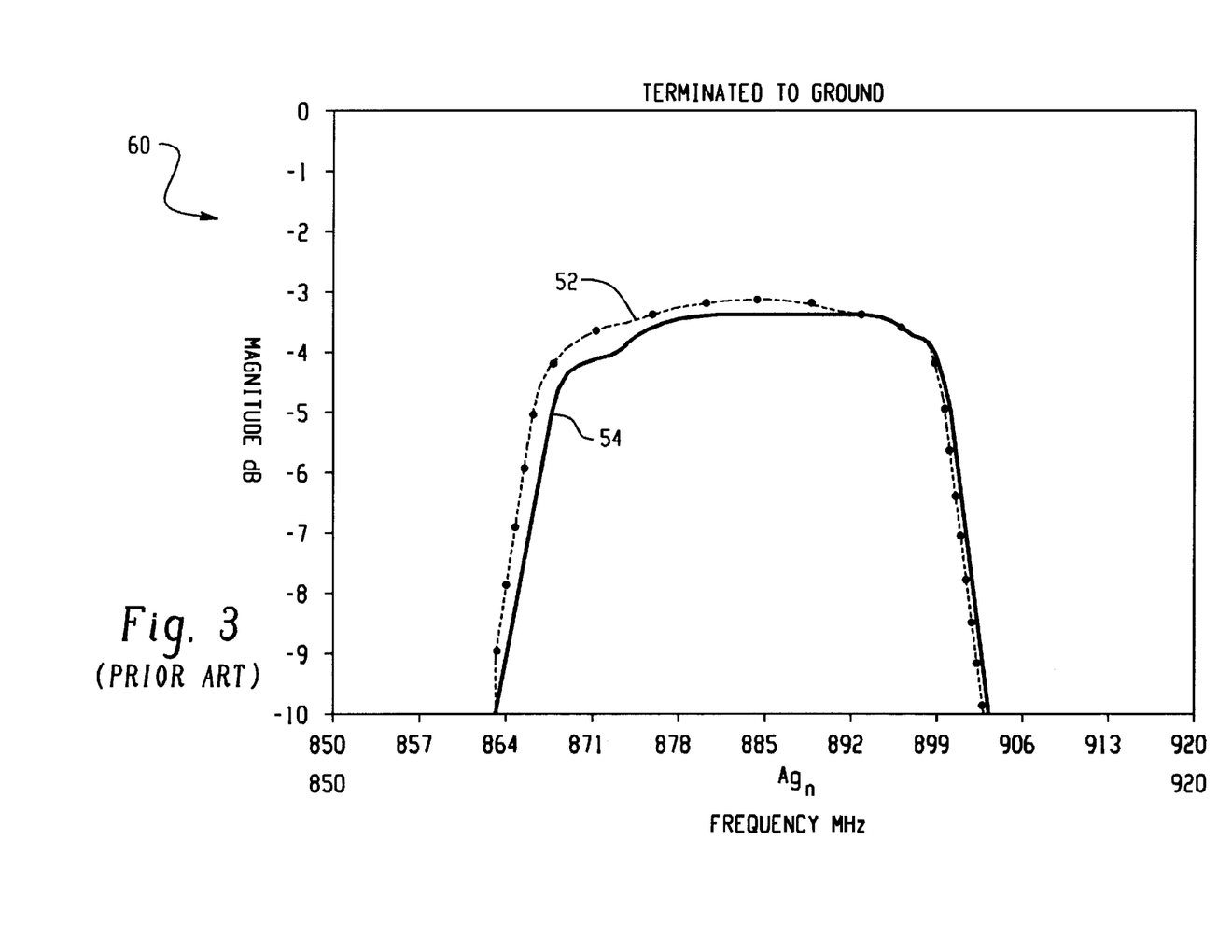
FIG. 3 is a plot showing the narrowband response of the same filter.

Recently, the trend has been to design the front-end of a radio transceiver with a differential input to the first mixer. The advantage of this type of design is to take advantage of the common mode rejection between the two differential inputs. This method then requires a differential SAW filter before the first mixer. Such a differential SAW filter is shown in FIG. 1, described in more detail below. As with most such differential SAWs, the structure shown in FIG. 1 suffers from an imbalance of the differential outputs. FIGS. 2 and 3 depict the imbalance in the differential outputs in this type of SAW. This imbalance is due to the nonsymmetrical coupling within the IDTs of the output stage.

Therefore, there remains a general need in this field for a differential SAW filter having a pair of balanced outputs.

SUMMARY OF THE INVENTION

The present invention overcomes the problems noted above and satisfies the needs in this field for a differential SAW filter having a pair of balanced outputs. More specifically, the present invention provides a differential SAW filter having a cascaded structure including at least an input SAW stage and an output SAW stage. The SAW stages are configured so that the electrical distance of travel of the surface acoustic waves from a single unbalanced input of the input stage to the dual balanced outputs of the output stage is electrically equidistant, thus resulting in a balanced differential output.

For brevity of discussion, the description of the invention is directed primarily to a cascaded structure receiving a single input and outputting two balanced signals. It is to be understood, however, the invention is not limited to this particular use. The invention would work just as well in an environment calling for a structure receiving two balanced signals and outputting an unbalanced single output.

In the invention, the input stage includes an unbalanced input coupled to a pair of outer IDTs, both of which launch a surface acoustic wave to an input stage inner IDT. The input stage inner IDT connects to the inner IDT of the output SAW stage, which launches a surface acoustic wave to a pair of output IDTs, referred as the first and second outer output IDTs respectively, that form the differential, balanced output signals.

In a preferred embodiment of the invention, in the input stage, the distances between the pair of outer IDTs and the inner IDT are preferably the same, and the distances between the pair of outer IDTs and their respective reflectors are the same. In the output stage, the distances between the inner IDT and the pair of outer output IDTs are not necessarily the same. Further, the distances between the pair of outer output IDTs and the reflectors adjacent thereto are not necessarily the same. Preferably, each of the output IDTs in the output stage has the same number of interdigital elements. In the output stage, preferably, two particular distances are predetermined to properly balance the filter. In this preferred embodiment, a distance, defined as So, between the first outer IDT and the input stage inner IDT is predetermined so as to produce a 180 degree phase shift between first and second output signals and a distance, defined as Ro, between the first outer IDT and an adjacent reflector is predetermined with the cumulative effect of Ro and So producing an effective integer number of quarter wave lengths for the output stage. The values of Ro and So would vary depending on the particular structural scheme of the filter.

The present invention provides many advantages over presently known SAW filters. Foremost of these advantages is the ability to provide a balanced differential output. A secondary advantage of providing this type of balanced output is that the common mode rejection of the filter is increased, thus providing better noise immunity. This is particularly important when the filter is coupled to subsequent amplification or other processing stages, whose performance depends upon a truly balanced output stage. Another advantage of the present invention is that having the outer IDTs, in the input stage, as inputs in parallel allows for higher input powers to be used in the differential SAW.

These are just a few of the many advantages of the present invention, as described in more detail below. As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

The present invention satisfies the needs noted above as will become apparent from the following description when read in conjunction with the accompanying drawings wherein.

DETAILED DESCRIPTION OF THE DRAWINGS

Referring now to the drawings, FIG. 1 sets forth a prior art differential SAW filter 10 including a cascaded input SAW stage 16 coupled to an output SAW stage 18. The input SAW stage 16 includes an unbalanced input terminal 12 connected to an inner IDT 21. For the purposes of the following description, an IDT comprises both an upper and lower side, where each side has a plurality of interdigital fingers or elements. The definition of IDT is to be construed to also include those IDTs that have an equal number of elements on their upper and lower sides and those IDTs that do not. In most instances, an IDT will have one side grounded, while the other side will be so-called 'hot' or electrically connected. As shown in FIG. 1, the inner IDT 21 includes a hot upper six element side and a corresponding grounded lower five element side. Also included in the input SAW stage 16 are two outer coupling IDTs 22, 24 and two reflectors 20. The outer coupling IDTs 22, 24 are connected via electrical connections 34, 36 to a pair of outer input IDTs 38, 40 of the output SAW stage 18. In addition to these outer input IDTs 38, 40, the output SAW stage 18 includes two reflectors 20, and one inner output IDT 14 having two outputs 14A, and 14B, which form the differential output of the filter 10.

Figure 8:
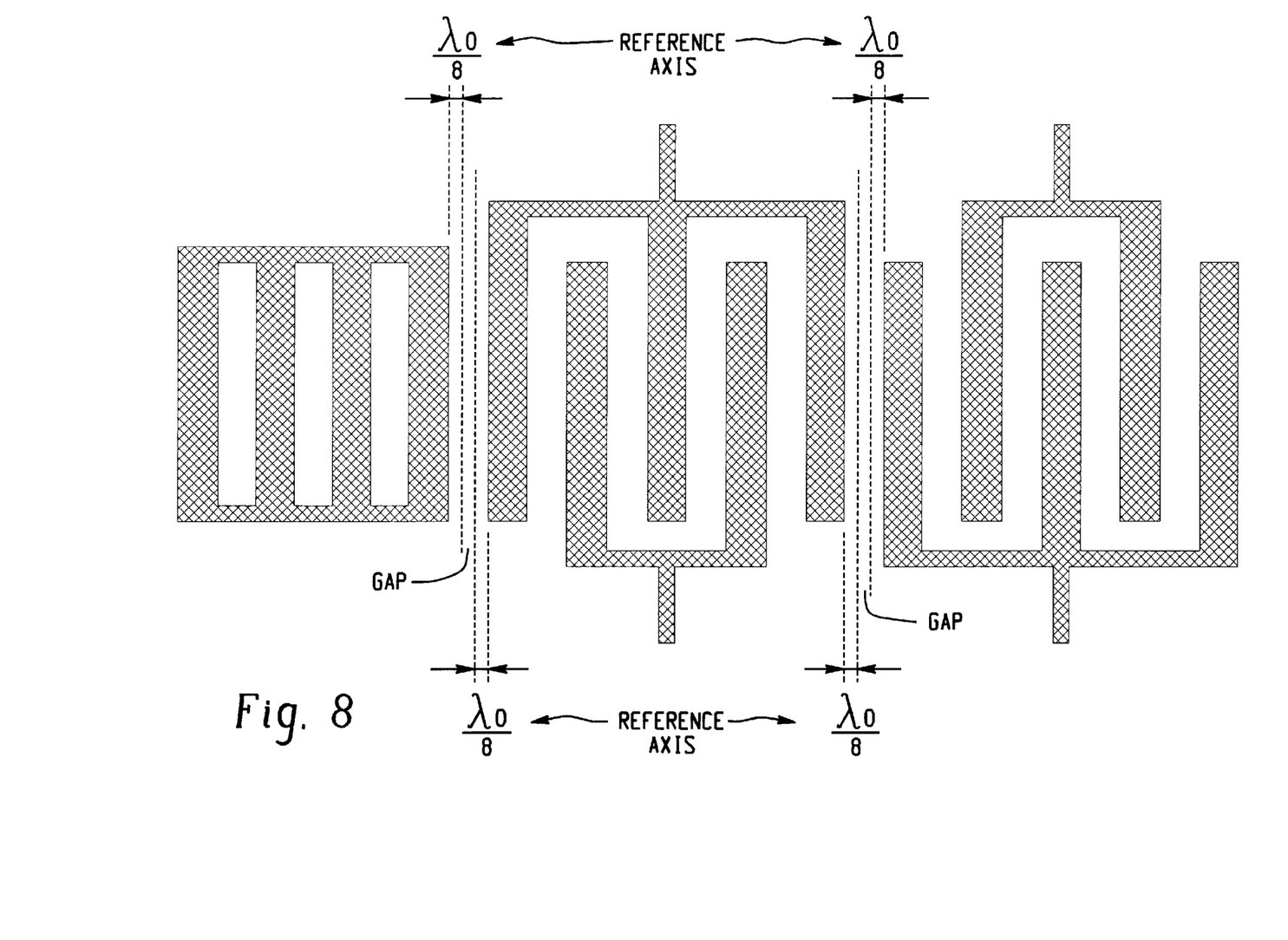
FIG. 8 is an illustrative view of two IDTs, a reflector and their respective reference axes therebetween; and, FIG. 9 is a layout diagram of another embodiment of the inventive cascaded SAW filter having balanced differential outputs.

Several "gaps" are defined with respect to reference axes between the various IDTs and reflectors as illustrated in FIG. 8. The reference axes are typically each $\lambda_o/8$ in width. The gap spacings are important to understand why the prior art filter 10 is unbalanced. In the input SAW stage 16, four gaps are defined, Gap R (referred to also as "dg" in the art) 26, 32 and Gap S (referred to also as "dt" in the art) 28, 30. Gap R describes the distance between the pair of outer coupling IDTs 22, 24 and the reflectors 20, and Gap S describes the distance between the inner IDT 21 and the pair of outer coupling IDTs 22, 24. In the output SAW stage 18, similar gap spacings are defined. Here, Gap R 42, 48 describes the distance between the pair of outer input IDTs 38, 40 and the reflectors 20, and Gap S 44, 46 describes the distance between the inner output IDT 14 and the pair of outer input IDTs 38, 40.

Operationally, the prior art SAW 10 functions as follows. An input electrical signal to the unbalanced input 12 is electrically coupled to the inner IDT 21, which, according to the well-known principles of SAW devices, converts the electrical signal to a mechanical wave (or surface acoustic wave) that propagates out from both ends of the inner IDT 21. This surface acoustic wave then propagates to the pair of outer coupling IDTs 22, 24, which, in a converse manner, convert the mechanical wave into an electrical signal. But some of the surface acoustic wave passes beyond the outer coupling IDTs 22, 24 and hits the reflectors 20, which bounce the wave back towards the inner IDT 21. This creates a resonance within the space defined between the two reflectors 20, thereby creating a sort of resonant cavity.

The electrical signal from the outer coupling IDTs 22, 24 is then fed to the two outer input IDTs 38, 40 of the output SAW stage 18 via electrical connections 34, 36. The outer input IDTs 38, 40 then convert the electrical signal back into a surface acoustic wave in the same manner as described above. A second resonant cavity is then formed between the two reflectors 20 of the output SAW stage 18. The formed surface acoustic waves impact the inner output IDT 14, which then convert the waves into two differential electrical signals 14A and 14B. Turning now to the gap spacings, in the input SAW stage 16, Gap R 26 is equal to Gap R 32, and Gap S 28 is equal to Gap S 30. There is a symmetry in the spacings, which results in balanced signals being transferred to the two outer coupling IDTs 22, 24. In the output SAW stage 18, however, although Gap R 42 and Gap R 48 are equal, the Gap S distances 44, 46 are slightly different depending upon which side of the inner output IDT 14 they are referenced to. As shown in FIG. 1, output 14A derives its signal from the upper five element side of inner output IDT 14. In contrast, output 14B derives its signal from the lower six element side of inner output IDT 14. Thus, the Gap S spacings, 44, 46, on either side of the inner output IDT 14 is shorter for output 14B and longer for output 14A. This asymmetry in the mechanical path of the surface acoustic waves results in an imbalance in the differential output stage, as shown in FIGS. 2 and 3.

FIG. 2 sets forth a plot 50 showing the measured wideband response of the prior art SAW filter of FIG. 1. Plot 54 shows the response measured at output terminal 2 14B, and plot 52 shows the response measured at output terminal 1 14A. This plot shows that the response at the two outputs 14A, 14B is different in the pass band (between about 865 and 902 MHz), as shown in more detail in FIG. 3, and is also very different in the stop band beyond the pass band (around 1000 MHz). Thus, the circuit is particularly unbalanced in this frequency region beyond the filter pass band. It is to be understood that the present invention would work in other frequency bands as well. The frequencies set out in the description are for illustrative purposes only.

FIG. 3 is a plot 60 showing the narrowband response of the same filter 10. As seen in this plot, there is a noticeable difference in the measurements 52, 54 at the two output terminals in the lower part of the pass band, between about 865 and 892 MHz. As described above, this imbalance in the output terminals is undesirable, particularly within the filter's pass band.

Figure 4:
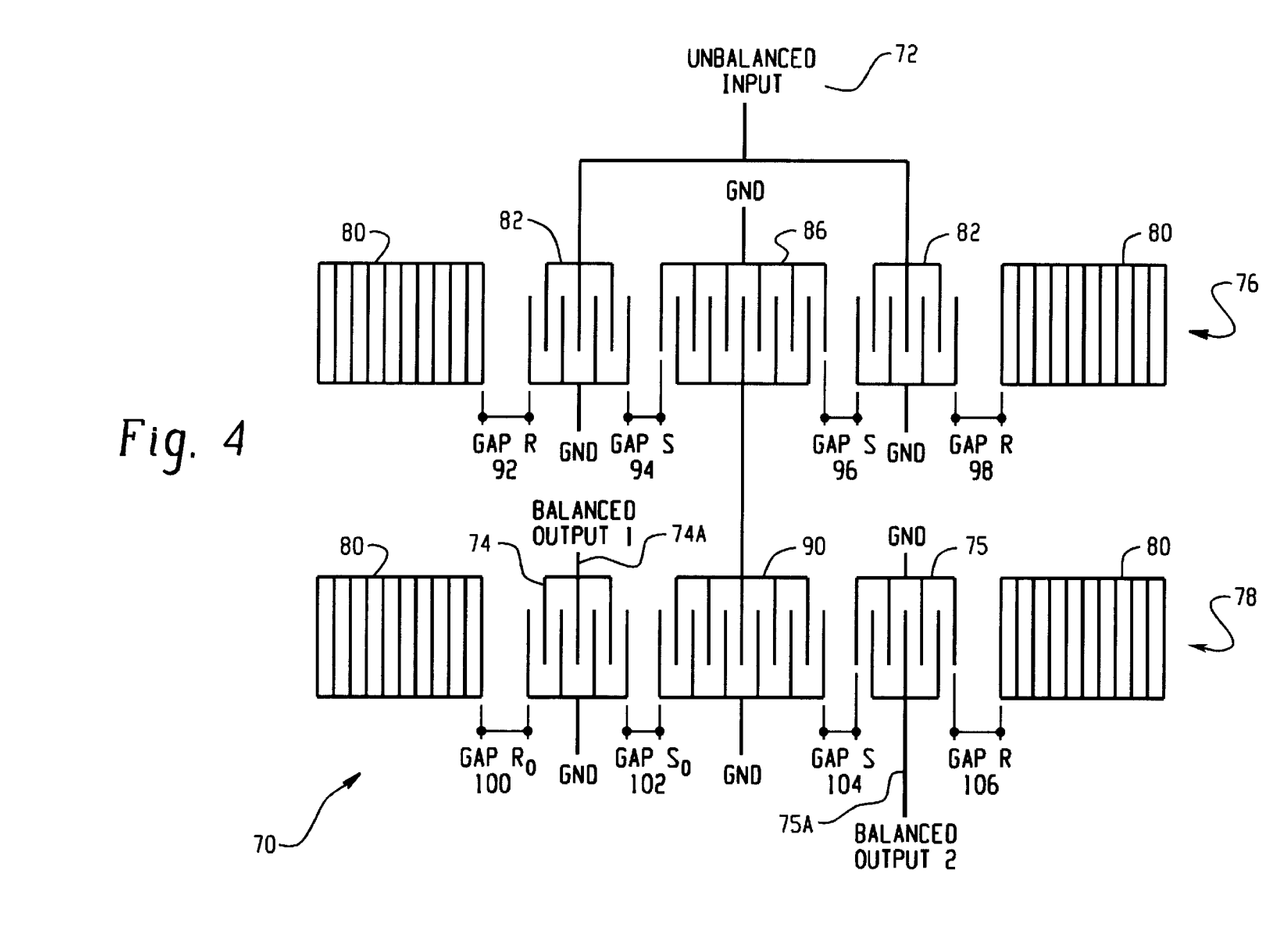
FIG. 4 is a layout diagram of the inventive cascaded SAW filter having balanced differential outputs.

Turning now to the present invention, FIG. 4 is a preferred layout diagram of the inventive cascaded SAW filter 70 having balanced differential outputs. This filter 70 includes an input SAW stage 76 cascaded to an output SAW stage 78. The input SAW stage 76 includes an unbalanced input 72 coupled in parallel to a pair of outer IDTs 82, and a single input stage inner IDT 86. The input stage inner IDT 86 connects the input SAW stage 76 to the output SAW stage 78. The output SAW stage includes an inner IDT 90 connected to the input stage inner IDT 86 of the input SAW stage 76, and a pair of outer output IDTs 74, 75 producing balanced outputs 74A and 75A respectively. The outer output IDTs 74, 75 are inverted relative to each other. Also included in both the input SAW stage 76 and the output SAW stage 78 are pairs of reflectors 80 for setting up the resonant surface acoustic wave within each stage. The preferred layout has the output stage mirrored to the layout of the input stage with the exception of the outer output IDT 74 being inverted.

As with the prior art device, there are certain gap distances that effect the performance of the filter. Turning first to the input SAW stage 76, Gap R 92, 98 describes the distance between the outer IDTs 82 and the reflectors 80. Gap S 94, 96 describes the distance between the pair of outer IDTs 82 and the input stage inner IDT 86. For the output SAW stage 78, Gap Ro, 100, describes the distance between the outer output IDT 74 and the reflector 80 adjacent thereto, and Gap So, 102, describes the distance between the inner IDT 90 and the outer output IDT 74. Gap R 106 describes the distance between the outer output IDT 75 and the reflector 80 adjacent thereto. Gap S 104 describes the distance between outer output IDT 75 and the inner IDT 90. In the preferred embodiment of the present invention, Gap S 94, 96 of the input stage and Gap S 104 of the output stage are equal, and Gap R 92, 98 of the input stage and Gap R 106 of the output stage are equal. However, as will be described below, Gap So 102 and Gap Ro 100 are not necessarily equal to Gap S and Gap R respectively.

Operationally, the filter 70 in FIG. 4 functions similarly to that shown in FIG. 1. An electrical signal on the unbalanced input 72 is electrically coupled to the pair of outer IDTs 82 which launch the mechanical surface acoustic wave into the resonant cavity bounded by the two reflectors. The established waves are coupled to the input stage inner IDT 86 and converted into an electrical signal. This signal is then connected to the inner IDT 90 of the output SAW stage 78. This inner IDT 90 then launches a mechanical surface acoustic wave into the resonant cavity bounded by the two reflectors 80 of the output SAW stage 78. This wave is received by the two balanced outer output IDTs 74, 75, which then convert the wave into balanced electrical signals, 74A, 75A respectively.

The inventive SAW shown in FIG. 4 is balanced because there is electrical symmetry in terms of what electrical lengths the outer output IDTs 74, 75 see—electrical symmetry that is missing in the prior art circuits. In the prior art, the gap sizes in the input stage are symmetrical, and so are the gaps in the output stage. However, the electrical length seen by the five element side of inner output IDT 14 is not the same electrical length seen by the six element side of inner output IDT 14. This is not the case in the present invention. In the present invention, despite the fact that the physical distances defined by Gaps Ro and So may be different from Gaps R and S of the output stage, respectively, the unique physical layout of the filter allows the three element side of outer output IDT 74 to see the same electrical length as the three element side of outer output IDT 75. This is partly achieved by the outer output IDTs being inverted to one another. In contrast, the prior art circuits have equal distances for each Gap S, and each Gap R respectively. The prior art circuits were also characterized by output signals deriving from the side of an IDT having a different number of interdigital elements. This resulted in the effective gap spacing defined by Gaps S 44, 46 being different for the upper and lower sides of the inner output IDT 14. In the present invention, however, this discrepancy dilemma has been resolved. In the present invention, both outer output IDTs 74, 75 have the same number of identical interdigital elements, but the outer output IDTs are not necessarily physically spaced equidistant from the output stage inner IDT 90.

In the input stage of the present invention, the size of Gaps R 92, 98, S 94, 96, and the number of interdigital elements of the inner and outer IDTs must be suitably chosen so as to provide an effective integer number of quarter wave lengths. Likewise, in the output stage, the size of Gaps Ro, So, R and S, and the number of interdigital elements of the inner and outer IDTs must be suitably chosen so as to provide for an effective integer number of quarter wave lengths. Of course, the integer value of the output stage may be different from that of the input stage depending on the selection of Ro and So. It is to be understood that, in the output stage, the collective effect of the number of interdigital elements of the output stage inner IDT 90 and the sizes of Gaps So 102 and S 104 play an important role in producing a 180 degree phase shift in the output signals. However, in the preferred embodiment of the present invention, the size of Gap S 104 in the output stage is fixed to the value of Gap S 94 in the input stage; the value of Gap R 106 in the output stage is fixed to the value of Gap R 98 in the input stage; the number of elements of the output stage inner IDT 90 is fixed to the same number found in the input stage inner IDT 86; and, the number of elements of the outer output IDTs 74, 75 is the same number found in the outer IDTs 82. This configuration is done so as to minimize impedance issues. Hence, in the preferred embodiment of the invention the sizes of only Gaps So and Ro are to be suitably selected depending on the particular configuration of the filter. In particular, the size of Gap So is selected so as to ideally produce the 180 degree phase shift in the two outputs 74A, 75A and at the same time, the size of Ro is selected so as to have the cumulative effect of Gap Ro and Gap So produce an effective integer number of quarter wave lengths for the output stage. Although the description is primarily directed to Gaps So 102 and Ro 100 as preferably being the two gaps adjusted for a particular structural filter layout, it is to be understood that it is possible and within the scope of the invention to have any gap spacing in the output stage to be designated as the gap spacing to be adjusted. With this in mind, all the Gaps 100, 102, 104, 106 of the output stage could very well be suitably adjusted so as to produce the effective integer number of quarter wave lengths in the output stage and to produce a 180 degree phase shift between the two outputs. Gaps So and Ro could be thought of as "shims" placed into the Gaps 100, 102, 104, 106. However, this approach has proven, at present, to be impractical.

Figure 5:
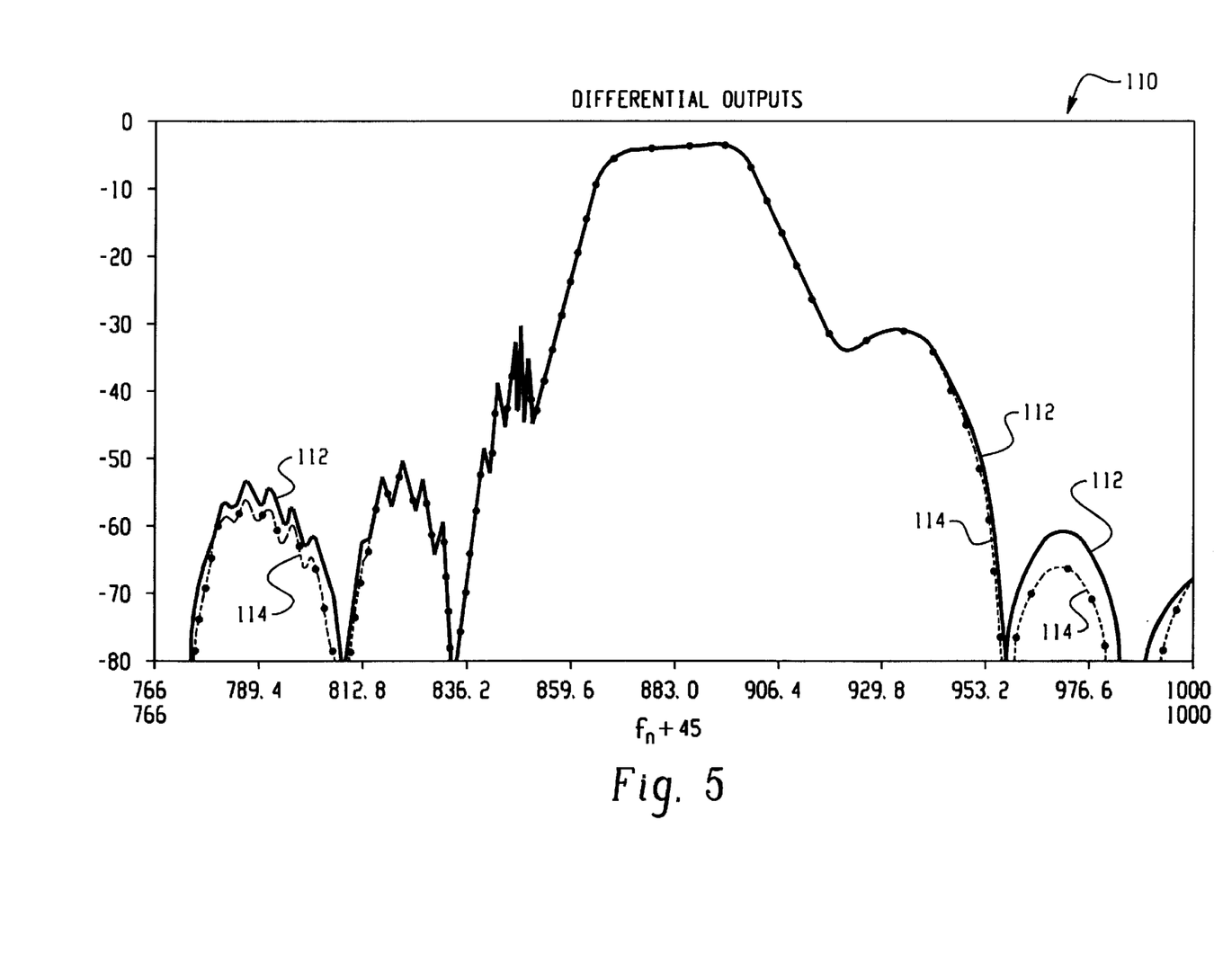
FIG. 5 is a plot showing the simulated wideband response of the inventive filter shown in FIG. 4.
Figure 6:
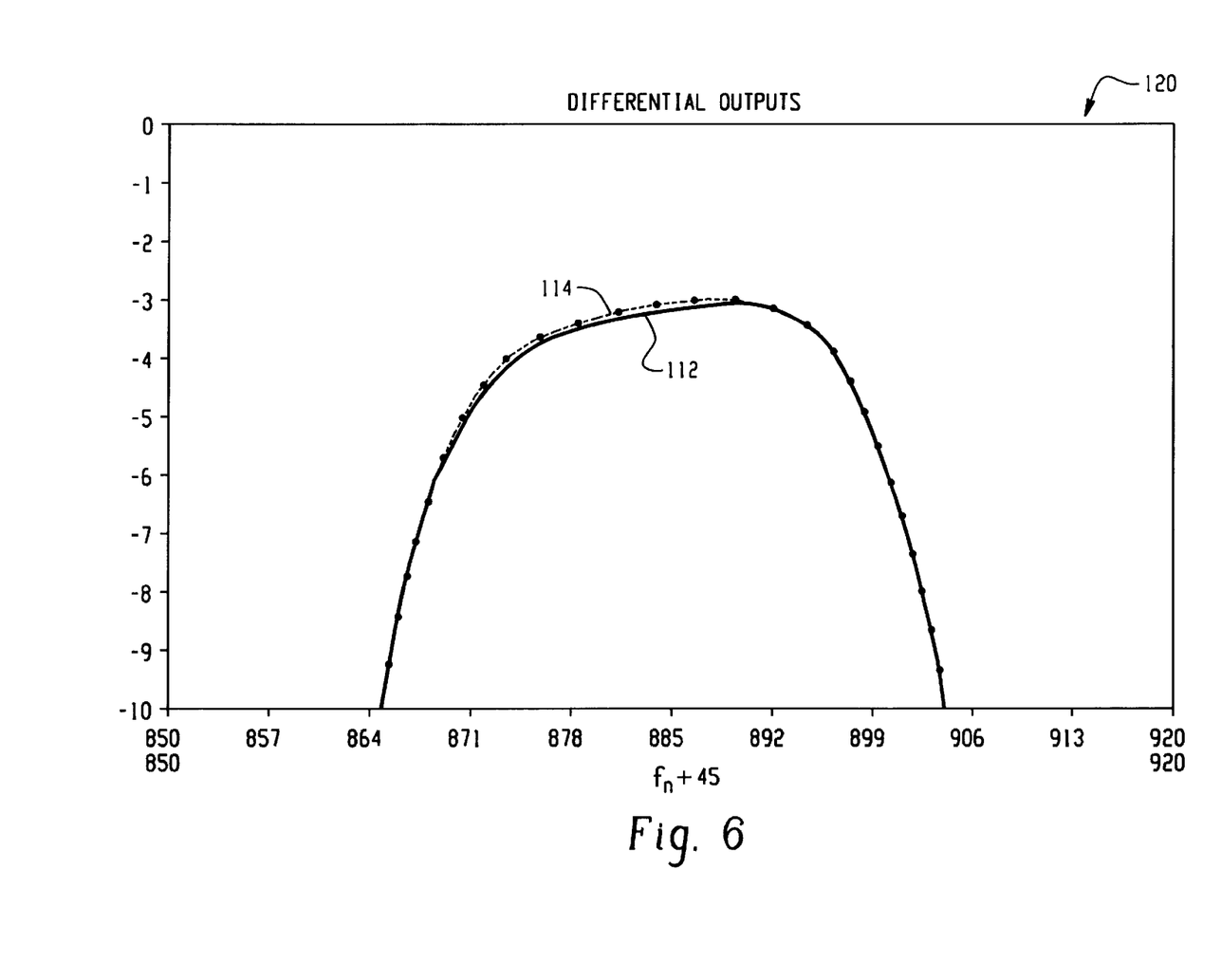
FIG. 6 is a plot showing the simulated narrowband response of the inventive filter shown in FIG. 4.

The circuit of FIG. 4 was electrically modeled using in part, the Three-Port Admittance Matrix method for an IDT. Within this model a feed-through component was also established to represent the extra length of bonding or connecting wire for Output 1 74A. FIGS. 5 and 6 illustrate the theoretical response of the circuit shown in FIG. 4. Note that when comparing to FIGS. 2 and 3, there is a significant reduction in the difference between the two outputs, particularly in the pass band of the filter. The following particulars were used in modeling the circuit. In both stages, the outer IDTs each has ten interdigital elements on the upper side, and nine elements on the other side. The inner IDTs each have thirteen elements on the upper side, and fourteen elements on the other side. Gaps R and Ro were defined as $0\lambda$ (with respect to the reference axes). Gap S was defined as $0.75\lambda$. Gap So was defined as $0.25\lambda$.

FIG. 5 is a plot 110 showing the simulated wideband response of the inventive filter shown in FIG. 4, and FIG. 6 is the corresponding plot 120 showing the simulated narrowband response. As seen in these plots, there is much less difference between the performance of output 1 74A, plotted as 112, and output 2 75A, plotted as 114. This is particular so in the pass band shown in FIG. 6, where the response is almost identical. It is believed that the slight difference in response is due to the feed-through component added to the model.

Although the present invention has been described in terms of an environment having a single unbalanced input and requiring two balanced outputs, it is be understood that the present invention could work in a reversed environment. The present invention would work effectively where the environment called for two balanced inputs and a single unbalanced output.

Figure 7:
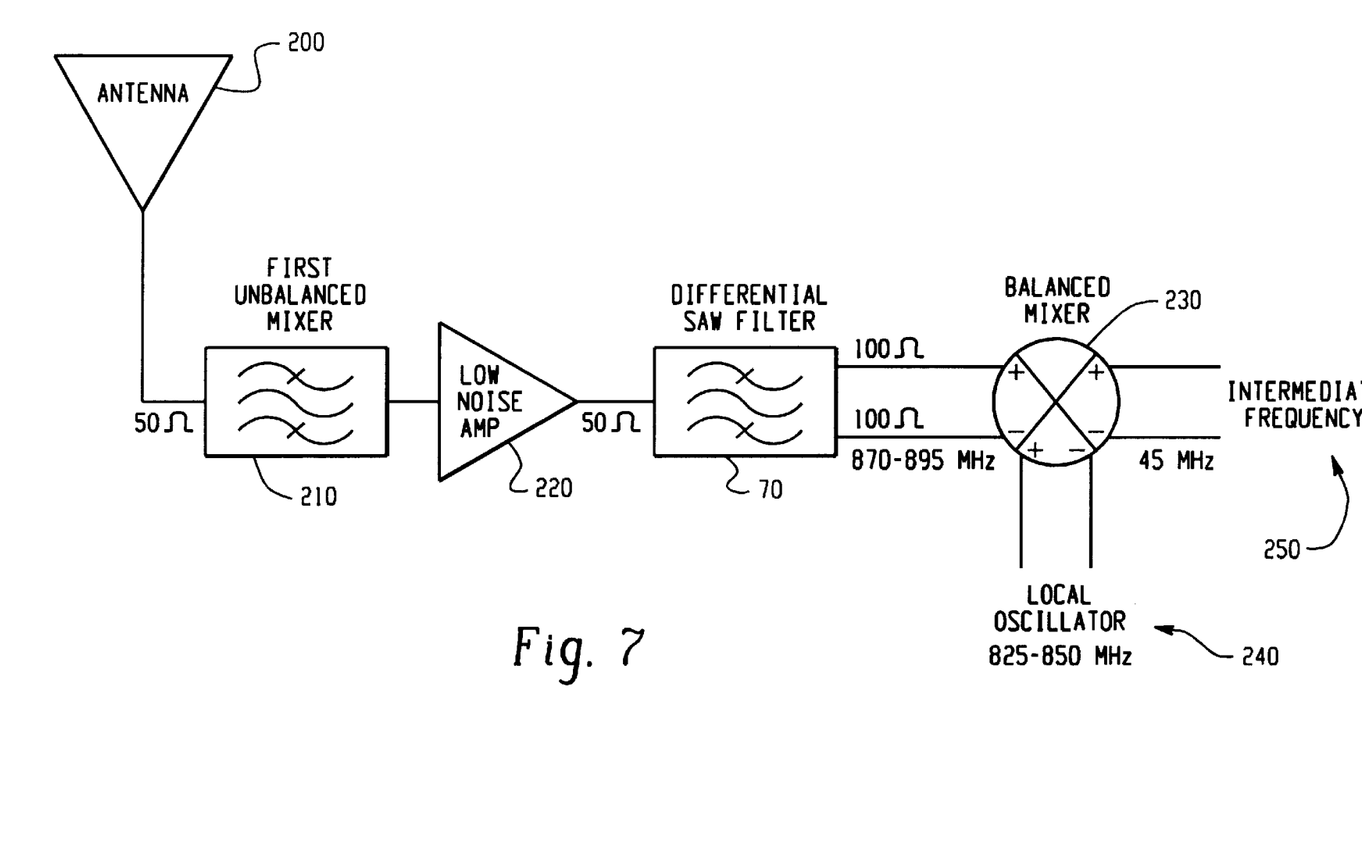
FIG. 7 is a partial schematic of the invention incorporated into a wireless communications device.

FIG. 7 illustrates on a partial schematic level how the invention would be incorporated into a wireless communications device at the receive end. Before the differential SAW device 70 there is shown an antenna means including: an antenna 200 communicating to a first unbalanced filter 210, and a low noise amplifier 220. Located down from the differential SAW device 70 is a communications circuit means comprising a balanced mixer 230, an intermediate frequency 250 and a local oscillator 240.

Figure 9:
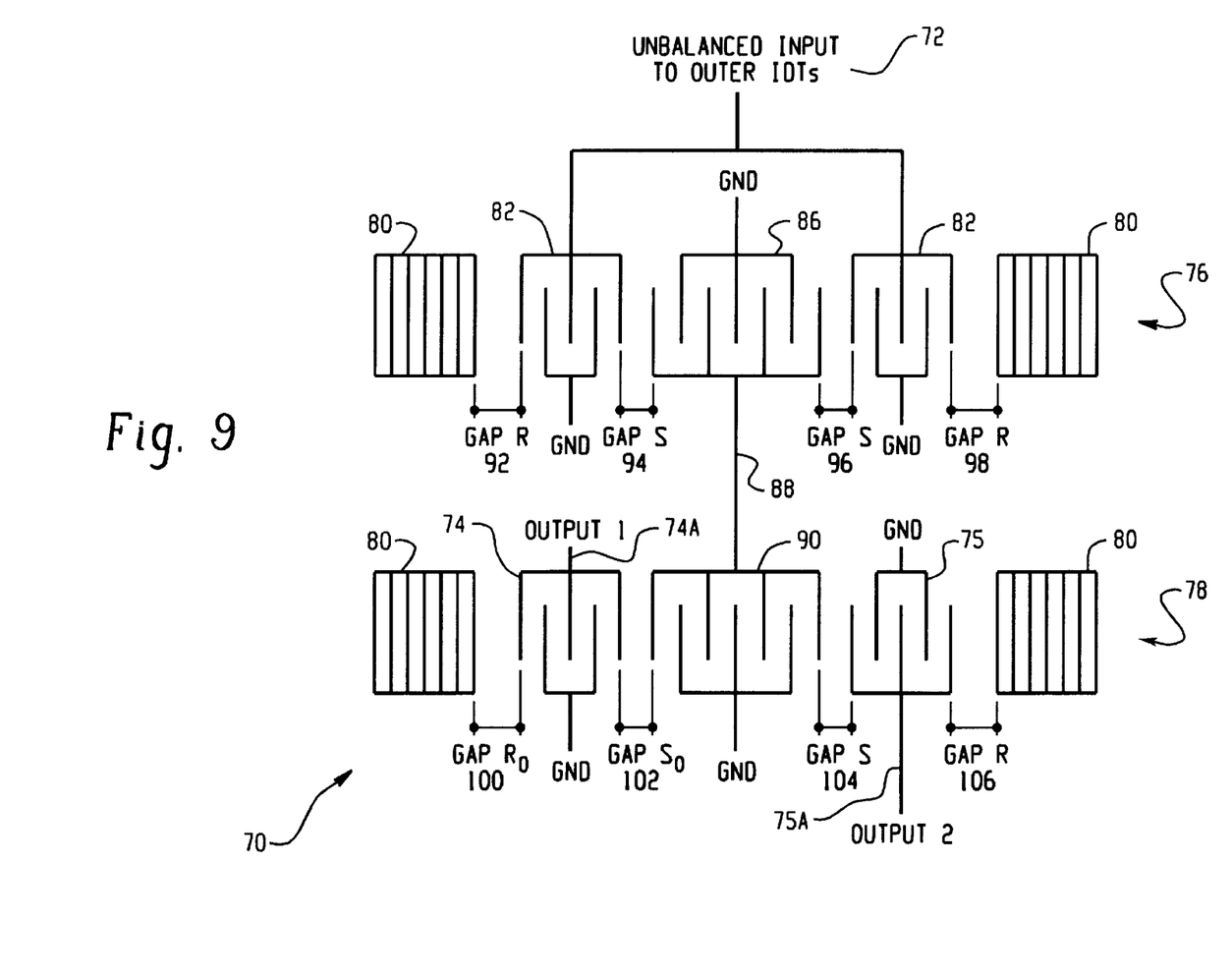

It will be appreciated that the above description relates to the preferred embodiment by way of example only. Many variations on the invention will be obvious to those knowledgeable in the field, and such obvious variations are within the scope of the invention as described and claimed, whether or not expressly described. FIG. 9 is one such example of another embodiment of the present invention.

For example, the outer output IDTs in the preferred embodiment have been described and illustrated with three interdigital elements on the upper side and two interdigital elements on the lower side. It is understood that the invention in no way is limited to this configuration of the outer output IDTs. A change in the structural makeup of the outer output IDTs would need to be suitably adjusted for by adjusting the So and Ro gap distances as described above.

As an additional example of another embodiment of the present invention, it is envisioned that a two IDT structure for the input stage may be possible.

I claim:

1. A differential surface acoustic wave (SAW) filter, comprising:

(a) an input filter stage for receiving an unbalanced electric signal and for filtering the unbalanced electrical signal into a conditioned electrical signal; and (b) an output filter stage for receiving the conditioned electrical signal via an output stage inner interdigital transducer (IDT), the output stage inner IDT converting the conditioned electrical signal into an acoustic wave and producing balanced first and second differential output signals via, respectively, first and second outer output IDTs, the first and second outer output IDTs being identical but inverted relative to each other.

2. The differential SAW filter of claim 1, wherein the output stage is configured so that the output stage inner IDT is electrically coupled to the input stage, the first outer output IDT and a first reflector adjacent thereto are positioned at a first end of the output stage inner IDT, and the second outer output IDT and a second reflector adjacent thereto are positioned at a second end of the output stage inner IDT.

3. The differential SAW filter of claim 2, wherein a first distance (So) between the first outer output IDT and the output stage inner IDT is predetermined so as to produce a 180 degree phase shift between the first and second output signals.

4. The differential SAW filter of claim 3, wherein a second distance (Ro) between the first outer output IDT and the first reflector adjacent thereto is predetermined with the cumulative effect of Ro and So producing an effective integer number of quarter wave lengths for the output stage.

5. The differential SAW filter of claim 4, wherein the input stage has an input stage inner IDT, a first outer IDT, a second outer IDT and at each end of the input stage a reflector positioned adjacent to the first and second outer IDTs.

6. The differential SAW filter of claim 5, wherein a third distance (S) between the input stage inner IDT and the first outer IDT is the same distance between the input stage inner IDT and the second outer IDT.

7. The differential SAW filter of claim 6, wherein a fourth distance (R) between the input stage first outer IDT and the reflector adjacent thereto is the same distance between the input stage second outer IDT and the reflector adjacent thereto.

8. The differential SAW filter of claim 7, wherein the output stage is further characterized by a distance between the second outer output IDT and the output stage inner IDT that is the same distance as S.

9. The differential SAW filter of claim 8, wherein the output stage is further characterized by a distance between the second outer output IDT and the second reflector adjacent thereto that is the same distance as R.

10. The differential SAW filter of claim 9, wherein Ro is 0λ, So is 0.25λ, R is 0λ, S is 0.75λ, the outer IDTs of both stages each have ten elements on one side and nine elements on the other side, and the inner IDTs of both stages each have thirteen elements on one side and fourteen elements on the other side.

11. A wireless communications device, comprising:

(a) an antenna;

(b) communications circuitry; and, (c) at least one multistage differential surface acoustic wave (SAW) filter coupled between the antenna and the communications circuitry, characterized by:

an input filter stage for receiving an unbalanced electric signal and for filtering the unbalanced electric signal into a conditioned electric signal; and an output filter stage for receiving the conditioned electric signal via an output stage inner interdigital transducer (IDT), the output stage inner IDT converting the conditioned electric signal into an acoustic wave and producing balanced first and second differential output signals via, respectively, first and second outer output IDTs, the first and second outer output IDTs being identical but inverted relative to each other.

12. The wireless device of claim 11, wherein the communications circuitry includes a receiver.

13. The wireless device of claim 12, wherein the communications circuitry includes a transmitter.

14. The wireless communications device as claimed in claim 13, further comprising: at least one reversed multistage differential surface acoustic wave filter characterized by:

a first stage comprising a balanced filter for receiving two balanced electric signals via, respectively, a first and second interdigital transducer (IDT), the first and second IDTs being identical but inverted relative to each other, and for converting the balanced electric signals into acoustic waves and producing a single non-distorted unbalanced electric signal; and a second stage for receiving the single unbalanced electric signal and for filtering the unbalanced electric signal into a further unbalanced electric output signal.

15. A differential surface acoustic filter, comprising:

(a) a first stage comprising a balanced filter for receiving two balanced electric signals via, respectively, a first and second outer input interdigital transducer (IDT), the first and second outer input IDTs being identical but inverted relative to each other, and for filtering the two balanced electric signals into a single unbalanced electric signal; and (b) a second stage for receiving the single unbalanced electric signal and for converting the single unbalanced electric signal into acoustic waves and producing a further unbalanced electric output signal.

16. The differential SAW filter of claim 15, wherein the first stage is configured so that the first stage inner IDT is electrically coupled to the second stage, the first outer input IDT and a first reflector adjacent thereto are positioned at a first end of the first stage inner IDT, and the second outer input IDT and a second reflector adjacent thereto are positioned at a second end of the first stage inner IDT.

17. The differential SAW filter of claim 16, wherein a distance (So) between the first outer input IDT and the first stage inner IDT is predetermined so as to produce a 180 degree phase shift between input signals.

18. The differential SAW filter of claim 17, wherein a distance (Ro) between the first outer input IDT and the first reflector adjacent thereto is predetermined with the cumulative effect of Ro and So producing an effective integer number of quarter wave lengths for the first stage.

19. The differential SAW filter of claim 18 wherein the second stage has a second stage inner IDT, a first outer IDT, a second outer IDT and at each end of the second stage a reflector positioned adjacent to such outer IDTs.

20. The differential SAW filter of claim 19, wherein a distance (S) between the second stage inner IDT and the first outer IDT is the same distance as between the second stage inner IDT and the second outer IDT.

21. The differential SAW filter of claim 20, wherein a distance (R) between the second stage first outer IDT and the reflector adjacent thereto is the same distance as between the second stage second outer IDT and the reflector adjacent thereto.

22. The differential SAW filter of claim 21, wherein the first stage is further characterized by a distance between the second outer input IDT and the first stage inner IDT that is the same distance as S.

23. The differential SAW filter of claim 22, wherein the first stage is further characterized by a distance between the second outer input IDT and the second reflector adjacent thereto that is the same distance as R.

24. The differential SAW filter of claim 23, wherein Ro is $0\lambda$, So is $0.25\lambda$, R is $0\lambda$, S is $0.75\lambda$, the outer IDTs of both stages each have ten elements on one side and nine elements on the other side, and the inner IDTs of both stages each have thirteen elements on one side and fourteen elements on the other side.

25. A wireless communications device, comprising:

(a) an antenna;

(b) communications circuitry; and (c) at least one reversed multistage differential SAW filter coupled between the antenna and the communications circuitry characterized by:

a first stage comprising a balanced filter for receiving two balanced electric signals via, respectively, a first and second IDT, the first and second IDTs being identical but inverted relative to each other and for converting the balanced electric signals into acoustic waves and producing a single non-distorted unbalanced electric signal; and a second stage for receiving the single unbalanced electric signal and for filtering the single unbalanced electric signal into a further unbalanced electric output signal.

26. The wireless communications device of claim 25, wherein the communications circuitry includes a transmitter.

27. The wireless communications device of claim 26, wherein the communications circuitry includes a receiver.

* * * * *